United States Patent
Yan

(12) 
(10) Patent No.: US 6,197,454 B1
(45) Date of Patent: Mar. 6, 2001

(54) CLEAN-ENCLOSURE WINDOW TO PROTECT PHOTOLITHOGRAPHIC MASK

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/222,043

(22) Filed: Dec. 29, 1998

(51) Int. Cl.⁷ .................................................. G03F 9/00
(52) U.S. Cl. .................................................. 430/5
(58) Field of Search .................. 430/5, 322; 428/14; 378/35

(56) References Cited

U.S. PATENT DOCUMENTS 5,096,791 * 3/1992 Yahalom .................. 430/5
5,935,739 * 8/1999 Bayer et al. .................. 430/5

* cited by examiner

Primary Examiner—S. Rosasco
(74) Attorney, Agent, or Firm—John Greaves

(57) ABSTRACT

A clean-enclosure to protect a reticle from contamination when using extreme ultraviolet (EUV) lithography is disclosed. The clean-enclosure consists of frame and a cover attached to the frame. The cover contains an exposure window comprised of a thin film of silicon. This thin film window allows EUV light to pass through to the reticle and reflect onto the photoresist layer of a semiconductor substrate with minimal transmission loss. Also, a process for forming the silicon thin film exposure window is disclosed.

34 Claims, 8 Drawing Sheets

CLEAN-ENCLOSURE WINDOW TO PROTECT PHOTOLITHOGRAPHIC MASK

FIELD OF THE INVENTION

The present invention relates to the field of photolithography. More specifically, the invention relates to a way of protecting a photolithographic mask using a clean-enclosure.

BACKGROUND OF THE INVENTION

A critical step in semiconductor processing is photolithography. The ability to achieve smaller and smaller dimensions on an integrated circuit is generally understood to be limited more by photolithography than any other fabrication step of the semiconductor process. As the industry heads toward forming submicron line dimensions, advanced photolithographic capabilities become ever more critical. Various new photolithographic techniques using smaller wavelength light sources are being developed, including Deep Ultra Violet Lithography, Extreme Ultra Violet Lithography (EUVL), and x-ray lithography.

In typical photolithography techniques, radiation from a light source is projected through a reticle, that is, a patterned mask, and an image of the pattern on the reticle is focused through a lens onto the radiation sensitive photoresist layer of a semiconductor substrate. The substrate may be a silicon wafer or other semiconductor substrate on which integrated circuits or micromechanical structures are fabricated.

A typical reticle comprises a patterned opaque material applied to one side of a transparent base. The base, typically comprised of quartz, is transparent to the projected radiation. The patterned opaque material, typically chrome, is opaque to the projected radiation. In addition to the desired pattern any defect in the reticle will also be projected onto the photoresist layer of the semiconductor substrate. For example, if a particle is present on the reticle during exposure of the photoresist layer, the image of the particle may be focused onto the photoresist layer. This corresponding defect in the photoresist pattern on the semiconductor substrate may cause the failure of the semiconductor device being manufactured.

EUVL, which typically uses a light source with a wavelength on the order of 13 nanometers (nm), is a promising technology for submicron integrated circuit fabrication. The base of a typical reticle is not transparent to ultra violet radiation in the extreme ultra violet (EUV) range because of the strong absorption of the base material. Therefore, a reflective reticle is used in EUVL.

Even when using reflective reticles, any reticle defects may be imaged onto the photoresist layer of the semiconductor substrate. The surface of the reflective reticle is very difficult to keep clean and any semiconductor device being manufactured may fail if particles are present on the reticle. The images of the particles may be focused onto the photoresist layer during exposure, leading to unacceptable defects in the semiconductor device.

Typically, a pellicle is used to protect a reticle and to keep it clean. A pellicle is a thin, flat, transparent membrane, usually made of an organic material. The pellicle is held by a frame and placed over the reticle. The frame of the pellicle holds it several millimeters away from the patterned surface of the reticle. The pellicle keeps particles from falling onto the surface of the reticle. Any particles that fall onto the pellicle will be outside the focal plane of the photolithography system, and therefore will not focus onto the semiconductor wafer during exposure.

FIG. 1 illustrates a prior art photolithography mask having a pellicle 110 mounted on the surface of a reticle 100. Pellicle 110 forms a covered or protected area 120 over the patterned area of reticle 100. Pellicle 110 includes a frame 130 and a thin, transparent membrane 140.

Pellicle 110 is effective at reducing the likelihood that particles will migrate onto reticle 100; however, prior art organic pellicle membranes 140 cannot be used in EUVL because these pellicle membranes are not transparent to EUV radiation. The pellicle membranes absorb an unacceptable amount of ultra violet light in the EUV range, especially when using the reflective reticles required in EUVL. This is because the source EUV radiation is absorbed twice as it makes a dual pass through the pellicle membrane on its reflected path to the semiconductor wafer.

There exists a need for a non-pellicle device to protect reticles and to prevent defects in semiconductor devices manufactured using EUVL. It would be advantageous to have a reticle-protective device that is readily manufacturable and compatible with both EUVL and currently used photolithographic manufacturing techniques.

SUMMARY OF THE INVENTION

Briefly, a clean-enclosure for protecting photolithographic reticles includes a frame and a cover bonded to the frame. The cover has an opening sealed with a window. The window comprises a thin film material that is transmissive to a predetermined range of wavelengths of light.

In a further aspect of the present invention, a method of forming a silicon thin film window is also described. A silicon oxide layer is deposited on the front side of a silicon wafer. A silicon thin film is deposited on top of this oxide layer. An opening is etched through the backside of the wafer to the oxide layer. The oxide layer in the opening is removed, leaving a thin film silicon window.

DETAILED DESCRIPTION

The invention includes a clean-enclosure which, when used as part of the photolithographic process of manufacturing microelectronic or micromechanical devices, reduces the number of particles that migrate onto the surface of a reticle. The invention may be used with any photolithographic process where particles on a reticle surface may cause the formation of defective patterns within a radiation sensitive layer of a semiconductor substrate. However, the invention is particularly useful for EUVL because of the strong absorption of EUV radation in prior art materials used to protect reticles. EUVL will be the context in describing the invention, although the invention can be used to protect reticles used in photolithography at other wavelengths, including, for example, ultra violet, deep ultra violet, and x-ray radiation.

Figure 1:
FIG. 1 is a cross-sectional view of a prior art photolithographic mask comprising a reticle protected by a conventional organic pellicle.
Figure 2:
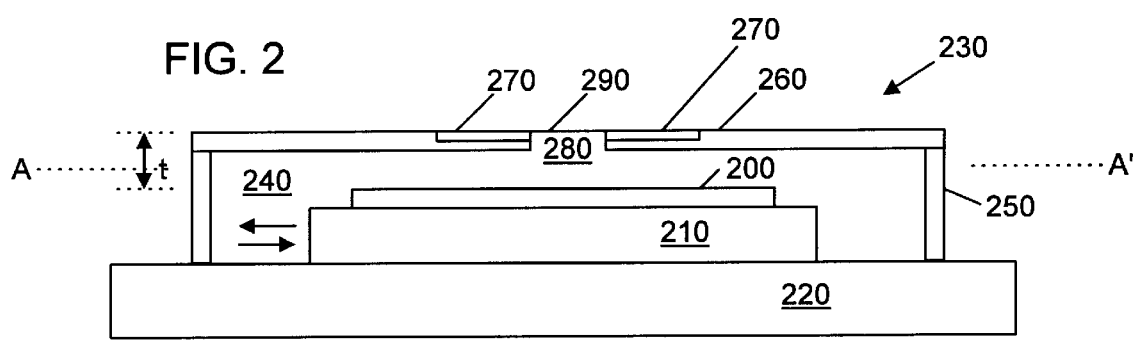
FIG. 2 is a cross-sectional view of a photolithographic mask comprising a reflective reticle on a moving base protected by a clean-enclosure in accordance with a preferred embodiment.

FIG. 2 is a cross-sectional view of an EUVL mask including a clean-enclosure in accordance with a preferred embodiment. The mask includes a reflective reticle 200 mounted on a moving reticle stage base 210. Moving reticle stage base 210 moves laterally across the surface of nonmoving reticle stage base 220 in a stepping motion such that one section of reflective reticle 200 is exposed to the stationary EUV source with each step. Clean-enclosure 230 forms a covered or protected area 240 over reticle 200 and moving reticle stage base 210. Clean-enclosure 230 prevents particles from falling onto the surface of reticle 200. Clean-enclosure 230 includes clean-enclosure frame (frame) 250 and clean-enclosure cover (cover) 260.

In the illustrative embodiment described herein, frame 250 comprises a metal alloy such as an aluminum alloy. Alternatively, a plastic compound or other material rigid enough to support cover 260 could be used. Frame 250 rests securely on nonmoving reticle stage base 220 such that it is centered around and encloses both reticle 200 and moving reticle stage base 210. Frame 250 may be attached to nonmoving reticle stage base 220 with adhesive materials. FIG. 2 shows frame 250 is a single, integral structure. Alternatively, frame 250 could be formed from individual pieces fastened together by bolts, screws, adhesives, or other means.

The walls of frame 250 should lie completely outside the stepping range of moving reticle stage base 210. Other equipment, such as any reticle handling equipment or particle detection equipment, for example, may also restrict the location of frame 250. Frame 250 may be rectangular as shown, however square or circular frames, for example, could be used if otherwise compatible with the reticle, the moving reticle stage base, and the other requirements of the photolithographic equipment.

Cover 260 lies over protected area 240 and is attached to frame 250 with adhesive materials. Cover 260 comprises a flat, horizontal piece of any material having adequate rigidity and thickness to lie completely horizontal over protected area 240. In order to properly align reticle 200 and the semiconductor substrate, a source of alignment radiation may be used. Cover 260 may comprise a material that is transmissive to the alignment radiation. For example, if the alignment radiation used is in the visible range of wavelengths, cover 260 may comprise a material such as quartz or glass. Alternatively, cover 260 could comprise a material that is not transmissive to the alignment radiation but which contains an alignment window or windows comprising a material transmissive to the alignment radiation.

Figure 3:
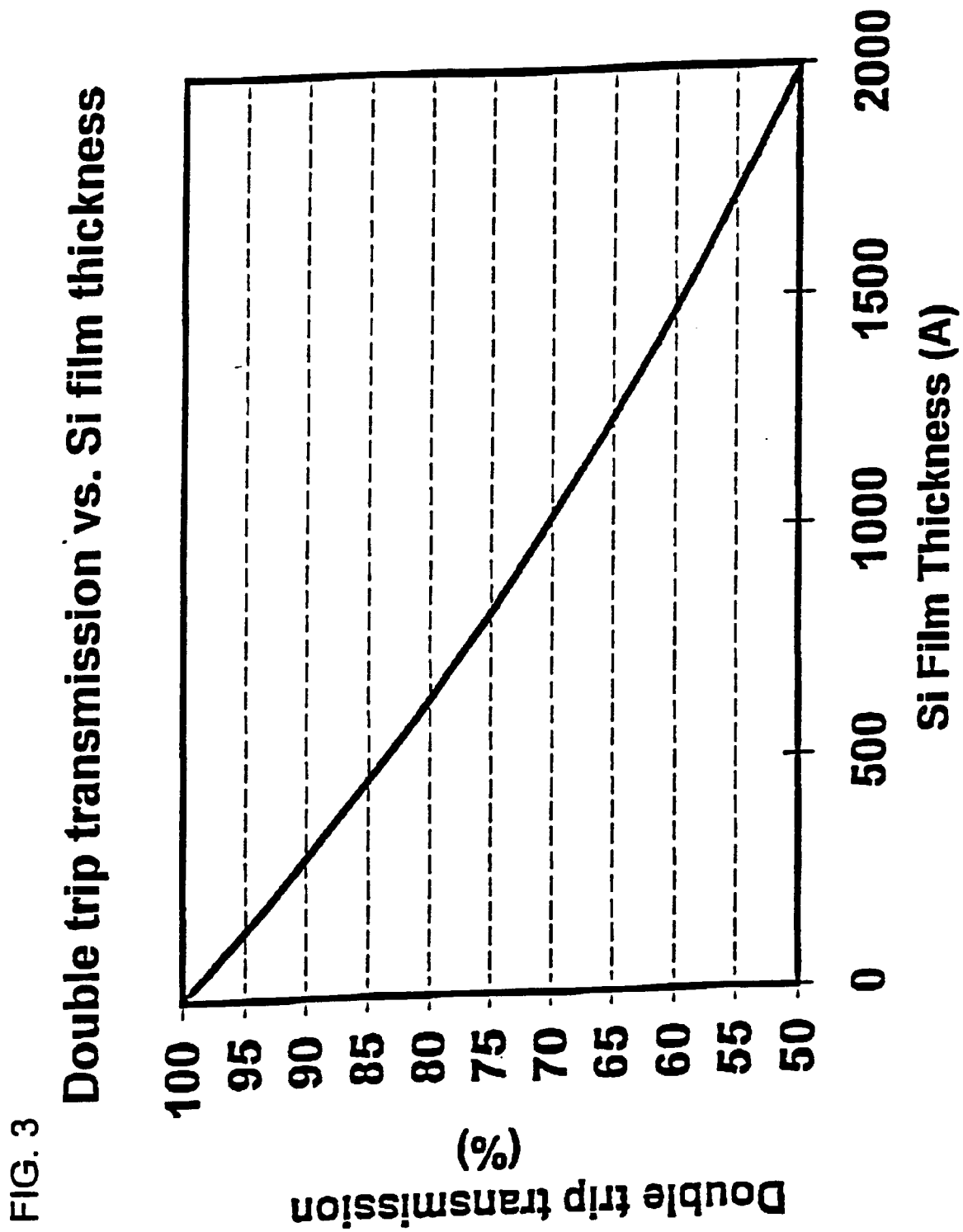
FIG. 3 is a graph showing the dual-path transmission of extreme ultraviolet (13 nm) light as a function of the thickness of a thin film of silicon.

Cover 260 contains a centrally located opening 280. By attaching border 270 to cover 260, opening 280 is sealed by an exposure window 290. Border 270 surrounds exposure window 290, physically protecting exposure window 290 during its handling and attachment to cover 260. Exposure window 290 may comprise a thin film of silicon. Silicon, when formed into a thin film with a thickness of 1000 angstroms, or less, is highly transmissive to EUV radiation. FIG. 3 is a graph showing the dual-path transmission of EUV (13 nm) radiation through a thin film of silicon as a function of the film's thickness. Assuming that a dual-path transmission loss of 30 percent or less is acceptable, a corresponding silicon film thickness of 1000 angstroms, or less, is preferred.

Alternatively, exposure window 290 could comprise another material having a high exposed light transmission at the required radiation wavelength. The alternate materials could include typical pellicle membranes 140 when used with non-EUV photolithography. For example, for photolithography using ultra violet radiation with a wavelength of approximately 193 nm, exposure window 290 could comprise fused silica or calcium fluoride (CaF). If it is required that clean-enclosure 230 be aligned with reticle 200 using radiation in the EUV range, cover 260 may contain an alignment window or windows, comprising a thin film of silicon, to aid in alignment. If alignment at another wavelength is required, these alignment windows could be comprised of another material having a high exposed light transmission at the required alignment radiation wavelength.

In the illustrated embodiment, clean-enclosure 230 has a minimum overall height as determined by a standoff distance t. As shown in FIG. 2, t is the distance between exposure window 290 and the surface of reticle 200. Maintaining a minimum standoff distance prevents any particles that may rest on exposure window 290 from focusing onto the photoresist layer of the semiconductor substrate. A typical minimum value for t is in the range of 6 to 10 mm. The overall height of clean-enclosure 230, being equal to the height of frame 250 added to the thickness of cover 260, must be great enough to maintain such a minimum standoff distance. Any adhesive materials used between frame 250 and cover 260, or between frame 250 and nomnoving reticle stage base 220, will contribute slightly to the overall height of clean-enclosure 230. The height of frame 250 or the thickness of cover 260 should be adjusted so that the overall height is correct. The height of the clean-enclosure has no maximum theoretical limit, but is usually restricted by the other requirements of the photolithography equipment.

Figure 4:
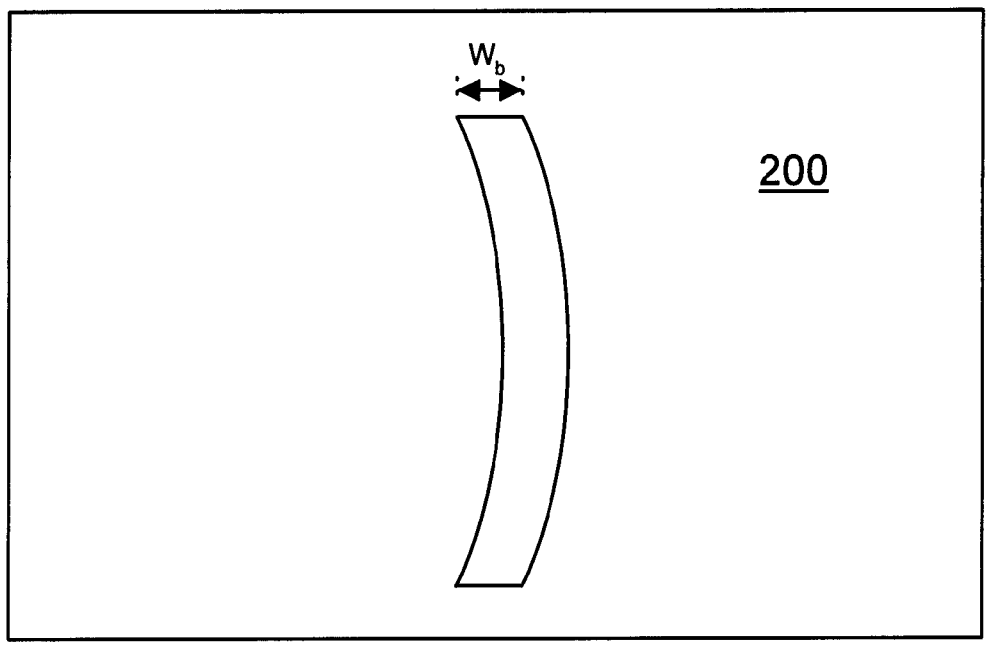
FIG. 4 is a top view of the approximate shape and size of the EUV radiation illumination, based on ringfield EUVL design, reflected on the reticle plane.

FIG. 4 is a top view illustrating the approximate shape and size of the radiation illumination reflected on the plane of reticle 200 based on one current EUVL design, "ringfield lithography." In ringfield lithography a stationary EUV radiation source, typically a synchrontron or a laser plasma source, is focused onto the reticle using a system of reflective optics. The ringfield lithography technique balances low order aberrations with higher order aberrations to create narrow annular regions of correction away from the optical axis of the system (regions of constant radius, rotationally symmetric with respect to the axis). Consequentially, the shape of the corrected region, and the resulting image field on the reticle surface as seen in FIG. 4, is an arcuate strip rather than a straight strip.

Figure 5:
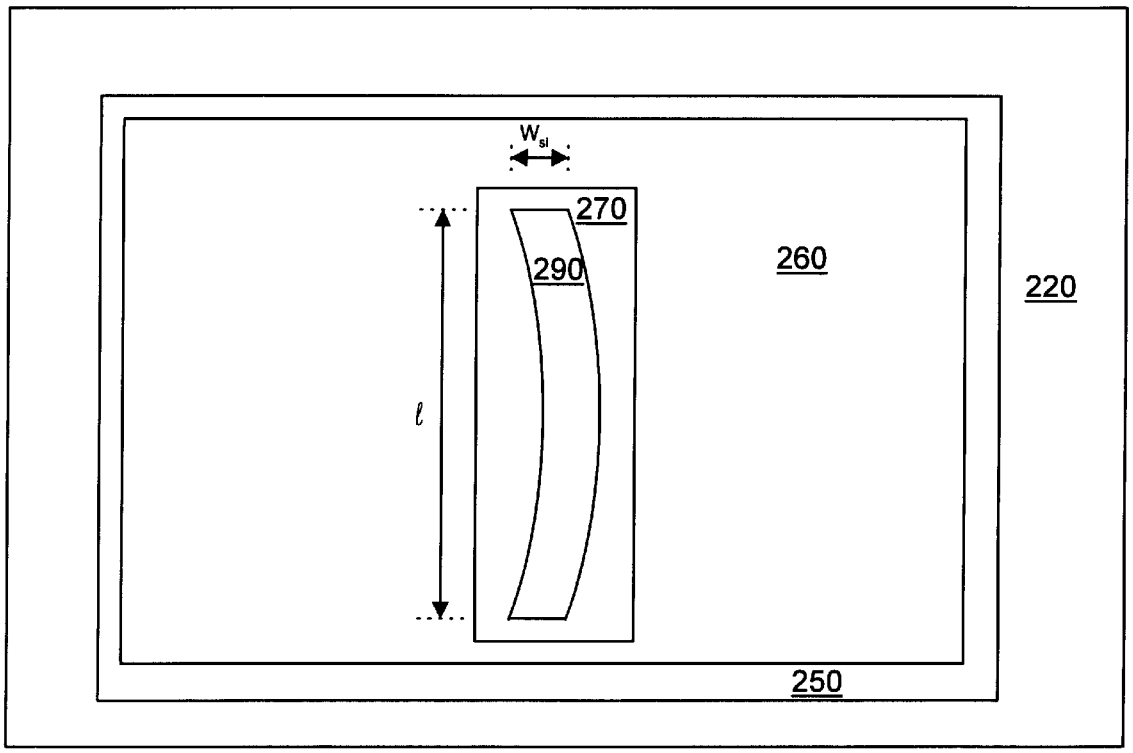
FIG. 5 is a top view of the FIG. 2 clean-enclosure cover and thin film exposure window taken along a line connecting A-A' of FIG. 2.

FIG. 5 is a top view of the FIG. 2 clean-enclosure cover 260 and exposure window 290, surrounded by border 270, taken along a line connecting A–A' of FIG. 2. The length l and approximate shape of cover opening 280 and corresponding exposure window 290 are dictated by the width of reticle 200 and the arcuate shape of the EUV radiation source, respectively. However, rectangular, square, or other off-axis field shapes are also possible and are contemplated. It is desirable that the width of exposure window 290 be as narrow as possible to minimize the stress placed on the silicon thin film material. Constraining the width of exposure window 290 to a few millimeters is not limiting given that reticle 200 is stepped on moving reticle stage base 210.

Figure 6:
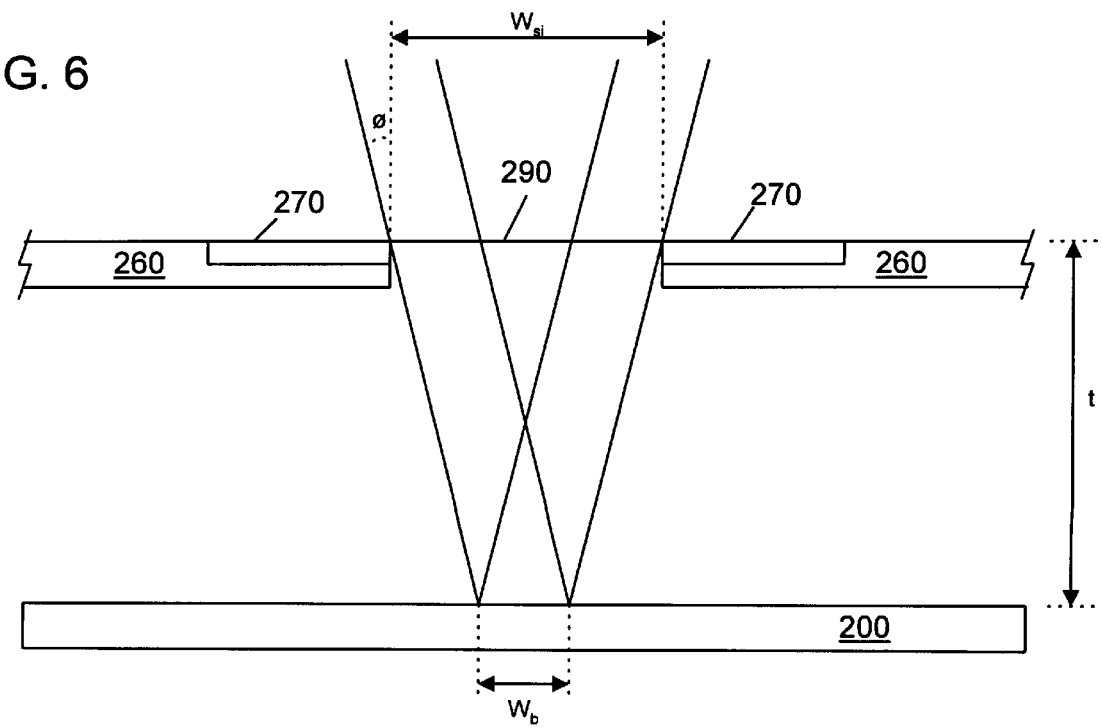
FIG. 6 is an enlarged cross-sectional view of the center portion of the FIG. 2 photolithographic mask showing the source radiation as it makes a dual pass through the thin film exposure window on its reflected path to the semiconductor wafer.

FIG. 6 is an enlarged view of the center portion of the FIG. 2 mask. The radiation source reflects off reticle surface 200 at an incident angle Ø. The standoff distance t must be a minimum height such that particles that may rest on exposure window 290 will not focus undesired patterns onto the photoresist layer on a semiconductor substrate. The standoff distance of conventional pellicles is approximately 6 mm. To obtain a desired illumination width $W_b$ on the reticle plane, the minimum width $W_{si}$ of exposure window 290 can be calculated from EQ. 1:

$$W_{si} = W_b + 2t \tan Ø \quad \text{EQ. 1}$$

where t is the standoff distance between exposure window 290 and the surface of reticle 200, and Ø is the illumination incident angle. For example, when using an illumination incident angle Ø of 5 degrees and a standoff distance t of 10 mm, obtaining an illumination width $W_b$ of 6 mm on the reticle plane requires a minimum window width $W_{si}$ of 9.5 mm.

Figure 7:
FIG. 7 is a cross-sectional view of a silicon wafer substrate used in the formation of the thin film exposure window.
Figure 8:
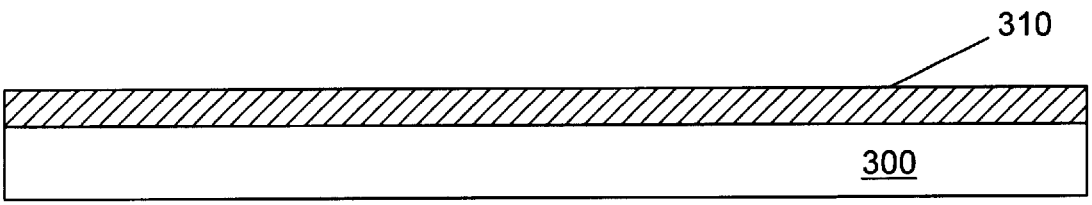
FIG. 8 is a cross-sectional view of the substrate of FIG. 7 after a silicon oxide layer is deposited.

FIG. 7 illustrates the starting material used to form a silicon thin film exposure window in one embodiment of the present invention. The starting material consists of a silicon substrate 300. Next, a silicon dioxide (SiO2) layer 310, as illustrated in FIG. 8, is formed on one side of substrate 300 using a well-known deposition technique such as chemical vapor deposition.

Figure 9:
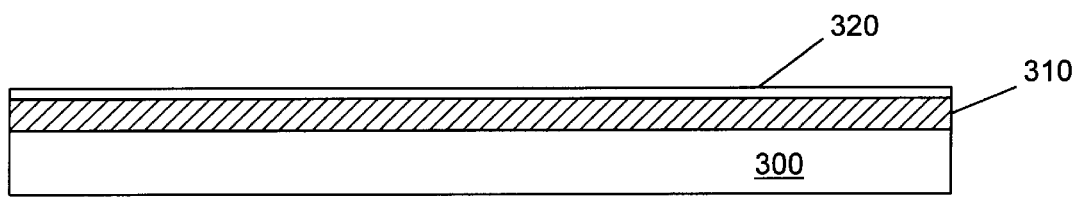
FIG. 9 is a cross-sectional view of the substrate of FIG. 8 after a silicon thin film is deposited.

Next, as shown in FIG. 9, a silicon thin film 320 is formed on the surface of the silicon dioxide layer 310 using chemical vapor deposition techniques. Silicon thin film 320 is formed with a thickness of 1000 angstroms, or less, over substantially the entire surface of silicon dioxide layer 310. As shown in FIG. 3, a silicon thin film with this thickness is highly transmissive to EUV radiation.

Figure 10:
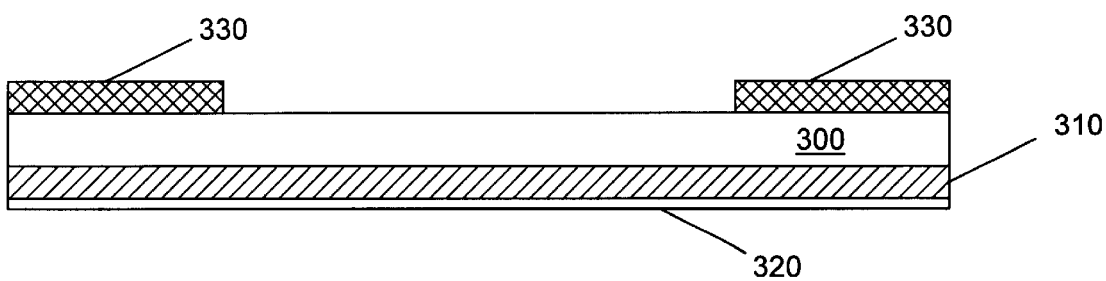
FIG. 10 is a cross-sectional view of the substrate of FIG. 9 after a photoresist layer is applied.
Figure 11:
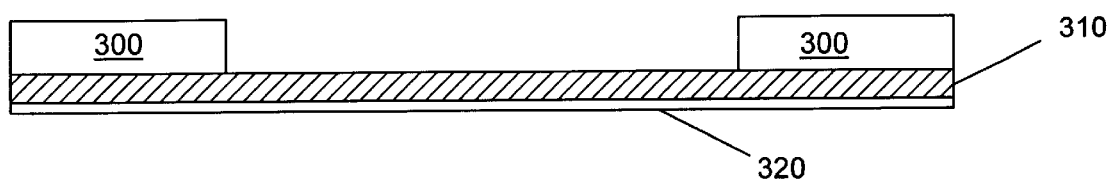
FIG. 11 is a cross-sectional view of the substrate of FIG. 10 after a thin film exposure window is etched into the silicon oxide layer.

Next, an opening is formed through the backside of substrate 300 for the exposure window. In this step, photoresist is applied over substrate 300 and exposed to light and developed so that a desired opening is formed in photoresist mask 330 in accordance with the dimensions of the to-be-formed exposure window 290. As illustrated in FIG. 10, photoresist mask 330 covers the entire surface of substrate 300 except where the opening will be formed. The opening is formed through substrate 300 to silicon dioxide layer 310, as shown in FIG. 11, when the part of substrate 300 not covered by the photoresist is etched away using wet chemical or plasma etch processes. Photoresist mask 330 is then removed by rinsing in a chemical solution or by stripping using oxygenated plasma.

Figure 12:
FIG. 12 is a cross-sectional view of the substrate of FIG. 11 after being wet etched.

As illustrated in FIG. 12, exposure window 290 is formed when the remaining silicon dioxide layer 310 is removed from the opening with a wet etch process with high selectivity, for example, a selectivity of 50 to 1, to the underlying silicon.

Figure 13:
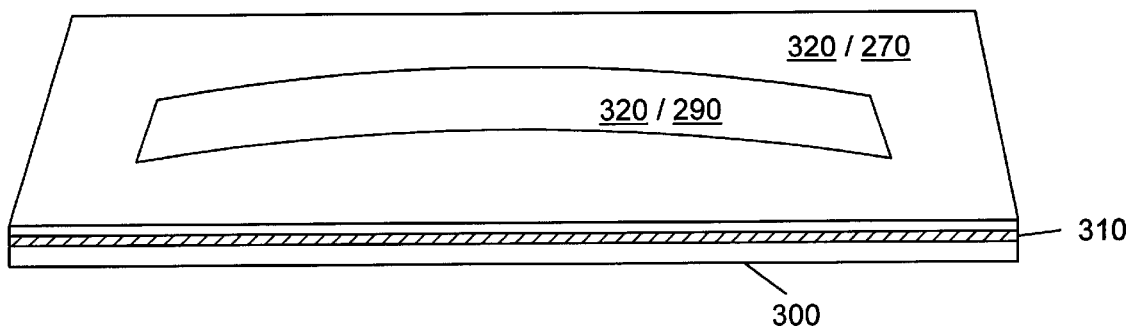
FIG. 13 is a perspective view of the window of the FIG. 12 mask in accordance with a preferred embodiment.

As illustrated in FIG. 13, some of the excess substrate 300 surrounding exposure window 290 may be retained as a border 270. Retaining a rigid border around exposure window 290 has a number of advantages. Border 270 physically supports and protects exposure window 290, allowing for ease of use and handling. Border 270 can readily be attached and detached from cover 260 repeatedly without damaging exposure window 290. This feature also allows clean-enclosure 230 to be used with a number of different exposure windows 290, comprising either silicon thin film or another material, without necessitating the removal of clean-enclosure 230 from nonmoving reticle stage base 220. If the size of the silicon substrate starting material used in forming exposure window 290 is large enough, the excess substrate 300 bordering exposure window 290 can be used in place of all or part of cover 260. If border 270 is not desirable, the excess substrate 300 surrounding exposure window 290 can be physically removed and exposure window 290 can be directly attached to cover 260 to seal opening 280.

The completed exposure window is used to seal the opening in the cover. The cover is secured to the frame and placed over a reflective reticle. During photolithography, the radiation is transmitted through the exposure window so that it reaches the reticle. The radiation reflects off the reticle and is again transmitted through the exposure window on its path to a semiconductor substrate. The exposure window provides radiation transmission to and from the reticle while the exposure window and cover protect the reticle from particle contamination.

As described in the foregoing, the embodiments of the present invention provide a solution to the problem of protecting a photolithographic reticle to limit defects in manufactured semiconductor devices. The invention is particularly useful for EUVL. While the invention has been described with reference to the structures and methods disclosed herein, it is not confined to the details set forth, rather, the invention is defined by the scope of the following claims.

What is claimed is:

1. A clean-enclosure comprising:
    a frame having two sides;
    a cover that is bonded to one side of the frame; and
    a window within the cover, the window comprising a material transmissive at least to an extreme ultraviolet (EUV) wavelength of photolithographic radiation.

2. A clean-enclosure as in claim 1, wherein the cover material includes quartz.

3. A clean-enclosure as in claim 1, wherein the window comprises a thin film having a thickness in the range of 1 to 1000 angstroms.

4. A clean-enclosure as in claim 1, wherein the window material is selected from the group consisting of silicon, fused silica, and calcium fluoride.

5. A clean-enclosure as in claim 1, wherein the window width is in the range of 1 to 20 millimeters.

6. A clean-enclosure as in claim 1, wherein the window is an arcuate shape.

7. A clean-enclosure as in claim 1, wherein the window is a rectangular shape.

8. A clean-enclosure as in claim 1, wherein the window is surrounded by a border.

9. A clean-enclosure as in claim 1, wherein the window is formed within the material of the cover.

10. A clean-enclosure as in claim 1, wherein the wavelength of photolithographic radiation used is in the range of 1 to 20 nanometers.

11. The clean enclosure as in claim 1, wherein the frame comprises an aluminum alloy.

12. The clean enclosure as in claim 1, wherein the frame comprises a plastic compound.

13. The clean enclosure as in claim 1, wherein the frame comprises a single, integral structure.

14. The clean enclosure as in claim 1, wherein the frame is attached to a nonmoving reticle stage base.

15. The clean enclosure as in claim 1, wherein the frame comprises individual pieces that are fastened together by means selected from bolts, screws, and adhesives.

16. The clean enclosure as in claim 1, wherein the frame comprises a square shape.

17. The clean enclosure as in claim 1, wherein the frame comprises a circular shape.

18. The clean enclosure as in claim 1, further comprising a reticle, wherein a standoff distance exists between the window and the reticle in a range from 6 mm to 10 mm.

19. A method of forming a clean-enclosure window comprising:

providing a silicon substrate having a first side and a second side;

forming a first layer of material useful as an etch stop relative to silicon on the first side of the silicon substrate;

forming a second layer over the first layer of material, the second layer being transmissive to at least an extreme ultraviolet (EUV) wavelength of photolithographic radiation;

forming an opening in the in the second side of the silicon substrate to the first layer of material; and removing the first layer of material in the opening so as to create a window from the remaining second layer of material.

20. A method as in claim 19, wherein the first layer material comprises an oxide of silicon.

21. A method as in claim 19, wherein the second layer comprises a thin film having a thickness in the range of 1 to 1000 angstroms.

22. A method as in claim 19, wherein the second layer comprises silicon.

23. A method as in claim 19, wherein the window width is in the range of 1 to 20 millimeters.

24. A method as in claim 19, wherein the window is an arcuate shape.

25. A method as in claim 19, wherein the window is a rectangular shape.

26. A method as in claim 19, wherein the window is surrounded by a border.

27. A method as in claim 19, wherein the wavelength of photolithographic radiation used is in the range of 1 to 33 nanometers.

28. The method as in claim 19, wherein forming an opening comprises forming an opening that has a minimum width of about 9.5 mm.

29. The method as in claim 19, wherein forming an opening comprises etching the silicon substrate with a wet chemical etch process.

30. The method as in claim 19, wherein forming an opening comprises etching the silicon substrate with a plasma etch process.

31. The method as in claim 19, wherein removing the first layer of material in the opening comprises a wet etching process.

32. The method as in claim 19, wherein removing the first layer of material in the opening comprises a wet etching process with an etch selectivity of about 50 to 1.

33. A method of protecting a photolithographic reticle comprising:

mounting a reticle on a substrate; and enclosing the reticle in a clean-enclosure that is attached to the substrate, wherein the clean enclosure includes a window comprising a layer of material that is transmissive to at least extreme ultraviolet (EUV) radiation.

34. A method as in claim 33, wherein the reticle is a reflective reticle.

* * * * *